United States Patent
Bruekers et al.

(10) Patent No.: US 6,285,301 B1
(45) Date of Patent: Sep. 4, 2001

(54) PREDICTION ON DATA IN A TRANSMISSION SYSTEM

(75) Inventors: Alphons A. M. L. Bruekers; Renatus J. Van Der Vleuten, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/270,441

(22) Filed: Mar. 16, 1999

(30) Foreign Application Priority Data

Mar. 18, 1998 (EP) .................................................. 98200864
Dec. 17, 1998 (EP) .................................................. 98204290

(51) Int. Cl.$^7$ ..................................................... H03M 7/34
(52) U.S. Cl. ............................................. 341/51; 341/67
(58) Field of Search ..................... 341/51, 67; 348/607; 375/285, 244; 704/220, 228

(56) References Cited

U.S. PATENT DOCUMENTS

| | | | |
|---|---|---|---|
| 4,075,655 | * | 2/1978 | Iijima et al. ............................ 358/13 |
| 4,918,729 | * | 4/1990 | Kudoh ................................... 704/226 |
| 5,249,200 | * | 9/1993 | Chen et al. ............................ 375/285 |
| 5,424,733 | * | 6/1995 | Fimoff et al. ........................... 341/67 |
| 5,434,948 | * | 7/1995 | Holt et al. ............................. 704/220 |
| 5,533,052 | * | 7/1996 | Bhaskar ................................ 375/244 |
| 5,602,602 | * | 2/1997 | Hulyalkar ............................. 348/607 |

* cited by examiner

Primary Examiner—Peguy JeanPierre
Assistant Examiner—Jean Bruner Jeanglaude
(74) Attorney, Agent, or Firm—Michael E. Belk

(57) ABSTRACT

A digital information signal is compressed into an encoded signal and coefficient data. The coefficient data is predicted, yielding a prediction signal. The coefficient data and the prediction signal are combined to a data signal. Both the encoded signal and the data signal are transmitted via the transmission medium.

30 Claims, 2 Drawing Sheets

PREDICTION ON DATA IN A TRANSMISSION SYSTEM

FIELD OF THE INVENTION

The invention relates to the field of digital signal compression and compressed signal transmission.

BACKGROUND OF THE INVENTION

The invention relates to a transmitting device for transmitting a digital information signal via a transmission medium, including:
- an adaptive encoder adapted to compress the digital information signal into encoded signal and to generate a parameter signal,
- a first signal combination unit adapted to combine the encoded signal and a representation of the parameter signal so as to obtain a transmission signal for the transmission via the transmission medium.

The invention further relates to a receiving device for receiving a transmission signal, to a method of transmitting a digital information signal and a representation of the parameter signal via a transmission medium, and to a record carrier obtained by the transmitting device or the method in accordance with the invention.

A transmitting and receiving device of the type defined in the opening paragraphs is known from J. Audio Eng. Soc., Vol. 44, No. 9, pp. 706–719, September 1996 and the AES preprint 4563, "Improved Lossless Coding of 1-Bit Audio Signals" by Fons Bruekers et al, 103rd AES Convention (New York, U.S.). The known transmitting device is intended for efficiently reducing the bit rate for the transmission of a digital information signal. A transmission signal thus obtained comprises an encoded version of the digital information signal and a representation of the parameter signal. The parameter signal contains parameters required in a receiving device in order to decode the encoded versions of the digital information signal into the digital information signal. The transmission signal obtained by means of the known transmitting device now demands less capacity from a transmission medium during the transmission of the digital information signal. The parameter signal can contain the coefficients used in an adaptive prediction filter or a probability table provided in the encoder. These coefficients are transmitted via the transmission medium. In the known receiving device the transmission signal is processed so as to generate a replica of the original digital information signal.

SUMMARY OF THE INVENTION

It is an object of the invention to provide a transmitting and/or a receiving device which reduces the bit rate for the transmission of a digital information signal more efficiently.

To this end, a transmitting device in accordance with the invention is characterized in that the transmitting device includes
- a device including a prediction filter for deriving a prediction signal which is an approximation to the parameter signal,
- a second signal combination unit for combining the prediction signal and the parameter signal so as to obtain the representation of the parameter signal.

A receiving device in accordance with the invention is characterized in that the receiving device includes:
- a signal combination unit for combining the representation of the parameter signal and a prediction signal so as to form the parameter signal,
- a prediction filter for deriving the prediction signal which is an approximation to the parameter signal.

A method in accordance with the invention is characterized in that the method further includes the steps of:
- deriving a prediction signal which is an approximation to the parameter signal,
- combining the prediction signal and the parameter signal so as to obtain the representation of the parameter signal.

The invention is based on the recognition of the fact that the number of bits required for transmitting a signal can be reduced by the use of a prediction filter. For this purpose the known transmitting device uses a prediction filter for the efficient compression of the digital information signal. Surprisingly, it has now also been found that the use of prediction on the parameter signal reduces the number of bits necessary for the transmission of the parameters.

BRIEF DESCRIPTION OF THE DRAWING

These as well as other aspects of the invention will now be described in more detail with reference to FIGS. 1 through 5.

DETAILED DESCRIPTION OF THE PREFERRED EMBODIMENT

Figure 1:
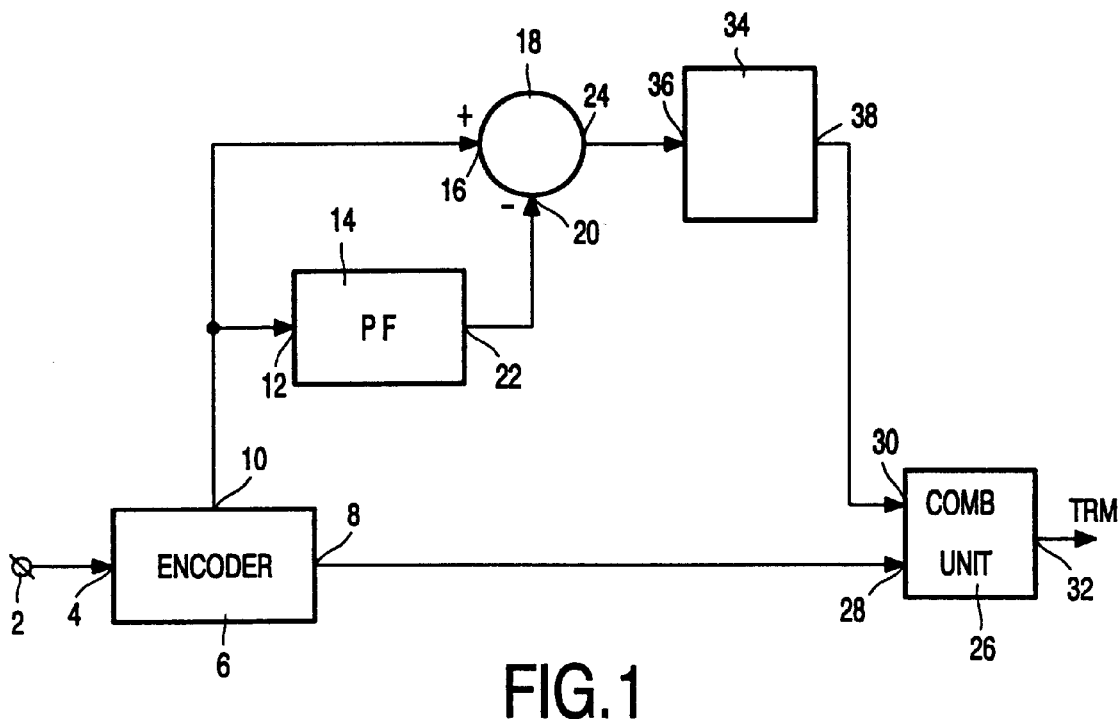
FIG. 1 shows a block diagram of a first embodiment of a transmitting device in accordance with the invention.

FIG. 1 shows an embodiment of a transmitting device in accordance with the invention. The transmitter has an input terminal 2 for receiving a digital information signal such as a digital audio signal. The digital information signal may have been obtained by the conversion of an analog version of the digital information signal into the digital information signal in an analog-to-digital converter. The input terminal 2 is coupled to an input 4 of an encoder 6. The encoder 6 is adapted to convert a digital signal applied to the input 4 into an encoded signal to be applied to a first output 8 of the encoder 6. The encoder 6 is further adapted to generate a parameter signal and to apply this to a second output 10. The parameter signal may contain the filter coefficients used in, for example, an adaptive prediction filter included in the encoder 6, or the values in a truth table provided for use in an arithmetic encoder included in the encoder 6. A transmitting device using both parameter types is known from the AES preprint 4563, Improved Lossless Coding of 1-Bit Audio Signals" by Fons Bruekers et al, 103rd AES Convention (New York, U.S.).

A prediction filter 14 has an input 12 coupled to the output 10 of the encoder 6. Prediction filters are generally known from the state of the art. A signal combination unit 18 has a first input 16 coupled to the output 10 of the encoder 6, has a second input 20 coupled to an output 22 of the prediction filter 14, and has an output 24. The signal combination unit is adapted to combine signals received at the inputs 16 and 20 to a residue signal to be applied to the output 24. In the present example the signal combination unit 18 takes the form of a subtractor circuit which subtracts the signal received at the second input 20 from the signal received at the first input 16.

A circuit block 34 is adapted to process the residue signal received at the input 36 and apply it to the output 38. The processing can be the unaltered transfer of the signal at the output. In another embodiment the circuit block may include an entropy encoder. The entropy encoder compresses the signal received at the input 36 so as to form a compressed signal to be applied to the output 38.

A second signal combination unit 26 has a first input 28 coupled to the output 8 of the encoder 6, has a second input 30 coupled to the output 38 of the circuit block 34, and has an output 32. The second signal combination unit is adapted to combine the signals received at the first input and the second input so as to form a transmission signal to be transmitted via a transmission medium TRM.

The transmitting device as described above operates as follows. The digital information signal is applied to the input terminal 2 and is supplied to the encoder 6. The digital information signal includes consecutive blocks. The encoder 6 converts the digital information signal into an encoded signal. The encoded signal is applied to the output 8 of the encoder. The encoder 6 includes coefficient selection means. The coefficient selection means derive from every consecutive block of the digital information signal which coefficients or parameters should be used in, for example, an adaptive prediction filter included in the encoder or a probability table for an arithmetic encoder. The selected parameters are transferred to the output 10. The prediction filter 14 derives a prediction signal from the parameters. Subsequently, the first signal combination unit 18 subtracts this prediction signal from the coefficients so as to form a residue signal, which is a representation of the parameter signal. By forming a prediction of a parameter and subtracting this from this parameter so as to obtain a residue signal, the amplitude range will decrease. A first transfer function of the prediction filter 14 can be, for example: $H(z)=2z^{-1}-z^{-2}$. A second transfer function of the prediction filter can be, for example: $H(z)=3z^{-1}-3z^{-2}+z^{-3}$. It is found that a transfer function of the prediction filter $H(z)=9/8z^{-1}+5/8z^{-2}-6/8z^{-3}$ gives a combination of both a good compression factor and relative simple to implement in hardware multiplication factors. Sometimes the parameter signal has a high frequent ripple. In this case the use of a prediction filter with the transfer function $H(z)=-z^{-1}$ results in a residue signal with the requested decrease in amplitude range. If the circuit block 34 transfers the signal unaltered to the output 38 a smaller number of bits will be required for transmitting the residue signal than for transmitting the parameter signal owing to the reduction of the amplitude range of the residue signal. If the circuit block 34 includes an entropy encoder the number of bits necessary for the reproduction of the residue signal can be reduced even further. The entropy encoder can be, for example, a Rice coder known from the state of the art. The entropy encoder compresses the residue signal so as to form a compressed signal. For the transmission of the compressed signal a smaller number of bits will be required than for the transmission of the residue signal. The entropy encoder does or does not provide a reduction of the number of bits depending on the parameter signal. It is likewise possible that the greatest bit reduction for the parameter signal can be achieved by means of a transmitting device which includes an entropy encoder but not a prediction filter.

In the second signal combination unit 26 the signals received at the inputs are combined to form the transmission signal. The digital information signal can be reconstructed from this transmission signal by means of an associated receiving device to be described hereinafter. For the transmission of a digital information signal by means of the afore-mentioned transmitting device a lower bit rate is obtained than by means of a device which does not include a prediction filter 14. Since the required bandwidth of the transmission medium is a linear function of the bit rate a transmitting device in accordance with the invention requires a smaller bandwidth for the transmission of the digital information signal. In other words, a transmitting device in accordance with the invention can transmit more information per unit of time via a transmission medium having a fixed bandwidth. The second signal combination unit 26 is not described in detail because it is known from the state of the art.

The transmission medium can be a transmission channel or a record carrier, such as a magnetic record carrier or an optical record carrier. The transmission signal is transmitted to a receiving device via the transmission medium TRM.

Figure 2:
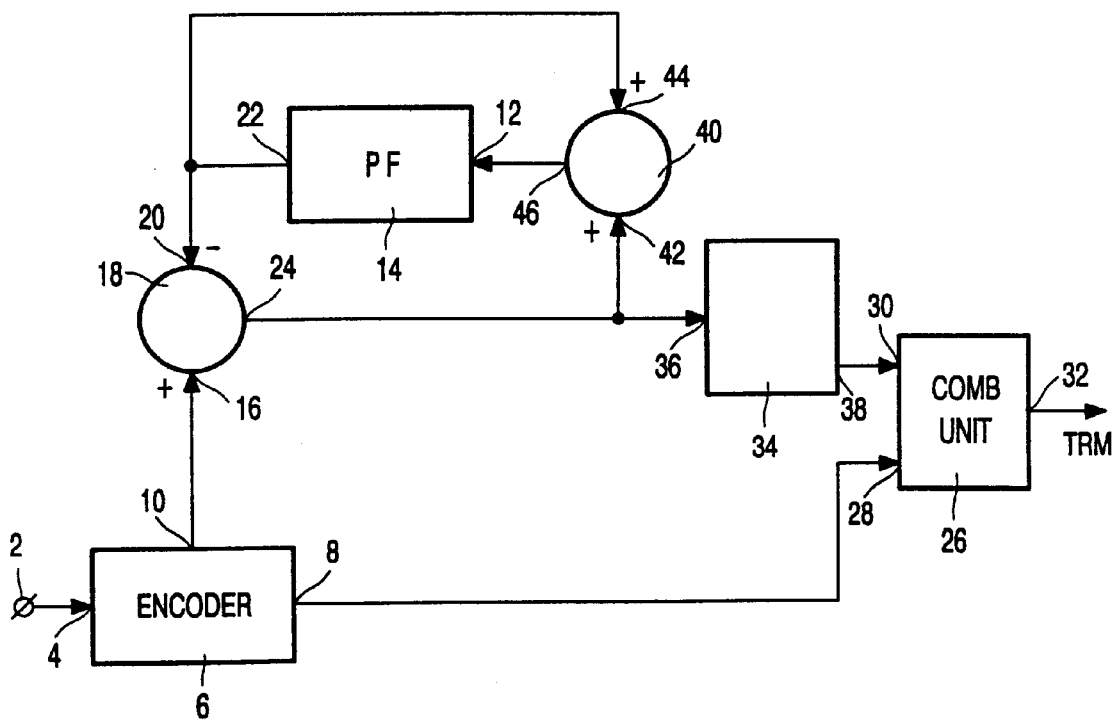
FIG. 2 shows a block diagram of a second embodiment of a transmitting device in accordance with the invention.

FIG. 2 shows a second embodiment of a transmitting device in accordance with the invention. The difference with the first embodiment resides in the fact that the input 12 of the prediction filter 14 is coupled to the output 10 of the encoder 6 in a different manner. For this purpose, the device includes a third signal combination unit 40. The first input 42 is coupled to the output 24 of the first signal combination unit 18. The second input 44 is coupled to the output 22 of the prediction filter 14. The third signal combination unit is adapted to combine the signals applied to the first input 42 and the second input 44 to one signal and to apply this to the output 46. The third signal combination unit 40 has its output 46 coupled to the input 12 of the prediction filter 14. In the present example the signal combination unit takes the form of an adder signal combination unit for adding the signals received at the two inputs to one another. The functionality of the first embodiment and that of the second embodiment is the same.

Figure 3:
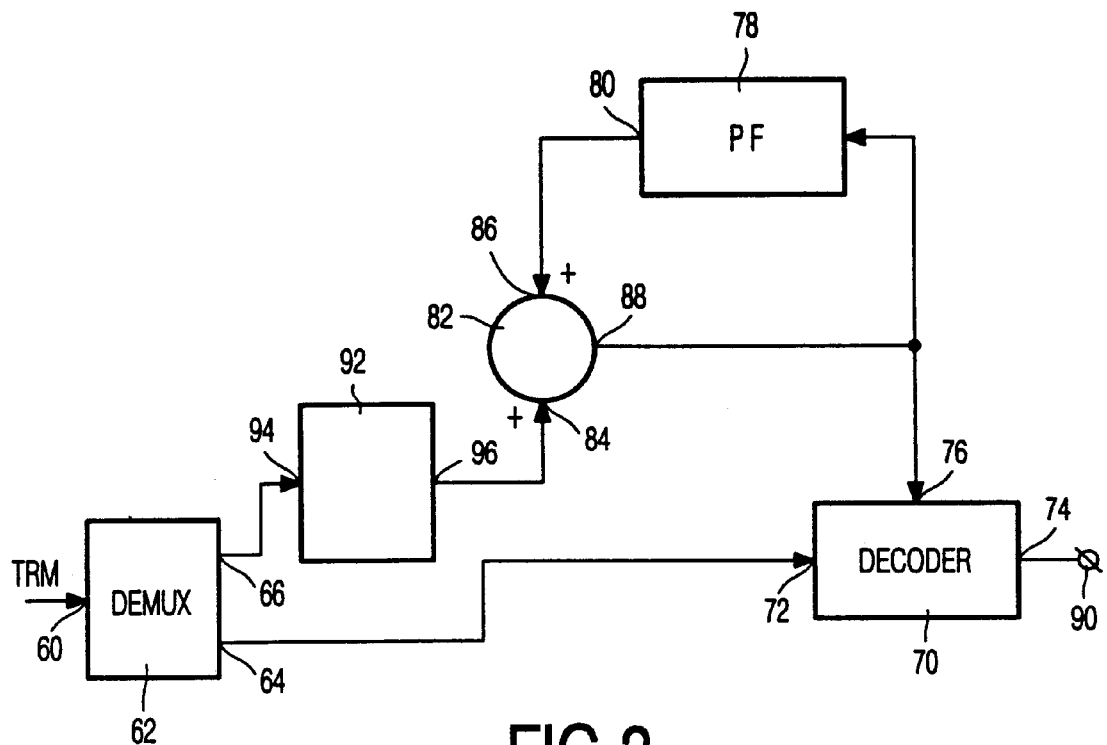
FIG. 3 shows a block diagram of a second embodiment of a receiving device in accordance with the invention.

FIG. 3 shows an embodiment of a receiving device for receiving a transmission signal. The receiving device derives a replica of the original signal from the received transmission signal.

The transmission signal TRM is received at an input 60 of a demultiplexing unit 62. The demultiplexing unit 62 derives an encoded signal and a representation of the parameter signal from the transmission signal TRM. The encoded signal is applied to a first output 64. The representation of the parameter signal is applied to a second output 66.

The demultiplexing unit 62 has its first output 64 coupled to an input 72 of an adaptive decoder 70. The adaptive decoder 70 is adapted to expand the signal received at the input 72 to a replica of the digital information signal in dependence upon coefficients received at the second input 76. The replica is applied to an output 74 of the decoder 70. A decoder can be realized as described in the AES preprint 4563, Improved Lossless Coding of 1-Bit Audio Signals" by Fons Bruekers et al, 103rd AES Convention (New York, U.S.). The output 74 is coupled to an output terminal 90 of the receiving device.

A circuit block 92 has an input 94 coupled to the output 66 and is adapted to process the signal received at the input 94 and apply the processed signal to the output 96. The processing can be the unaltered transfer of the signal at the output 96. In another embodiment the circuit block 92 may include an entropy decoder. The entropy decoder expands the signal received at the input 94 so as to form an expanded signal to be applied to the output 96. The entropy decoder can take the form of a Rice decoder.

A signal combination unit 82 has a first input 84 coupled to the output 96 of the circuit block 92, has a second input 86 coupled to an output 80 of a prediction filter 78, and has an output 88. The signal combination unit 82 is adapted to combine a signals received at the first input 84 with a signal received at the second input 86 so as to form a parameter signal, which is applied to the output 88. The signal combination unit 82 can take the form of an adder circuit, which adds the signal received at the second input 86 to the signal received at the first input 84. The sum signal is applied to the output 88. The construction of the prediction filter 78 is identical to that of the prediction filter 14 used in the transmitting device that has transmitted the transmission signal.

The receiving device shown in FIG. 3 operates as follows. The demultiplexing unit 62 splits the transmission signal received at the input 60 into an encoded signal and a representation of the parameter signal. The representation of the parameter signal is applied to the circuit block 92 and processes this signal so as to form a residue signal. The residue signal and a prediction signal are added to form a parameter signal in the signal combination unit 88. The parameter signal is applied to a prediction filter 78 and an adaptive decoder 70. In the prediction filter 78 the prediction signal is derived from the parameter signal. In the adaptive decoder 70 the encoded signal is converted into a replica of the digital information signal. The adjustable parameters in the adaptive decoder are received at the input 76. Adjustable parameters are, for example, the coefficients of a prediction filter or the values of a probability table. Prediction filters and decoders are generally known from the state of the art.

Depending on the embodiment of the transmitting device the receiving device includes only a prediction filter 78, or a prediction filter 78 and a circuit block 92 in the form of an entropy decoder, or only a circuit block 92 in the form of an entropy decoder.

Figure 4:
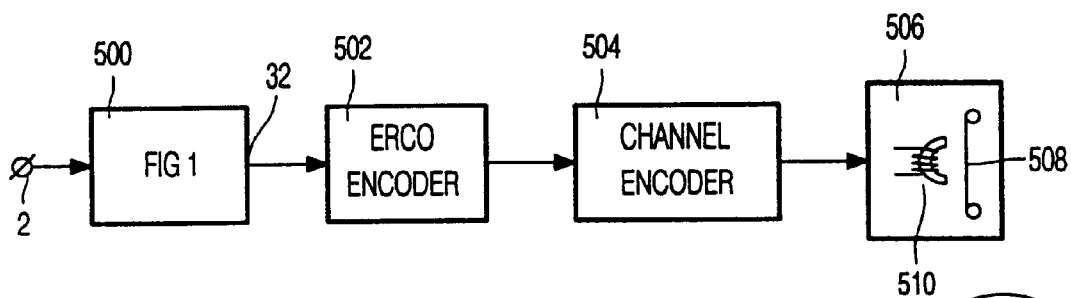
FIG. 4 shows a block diagram of a transmitting device in the form of a recording apparatus.

FIG. 4 shows a transmitting device in the form of an apparatus for recording the digital information signal on a record carrier. The circuit block 500 in FIG. 4 replaces the block diagram of FIG. 1. The input terminal 2 in FIG. 4 is identical to the input terminal 2 in FIG. 1 and the output 32 of the circuit block 500 is identical to the output 32 of the signal combination unit 30 in FIG. 1. The recording apparatus further includes an error-correction encoder 502, a channel encoder 504 and write means 506 for writing the signal onto the record carrier 508. Error-correction encoders and channel encoders are generally known from the state of the art. The record carrier 508 can be of the magnetic type. In that case the write means 506 include one or more magnetic heads 510 adapted to write the information in a track on the record carrier 508. In another embodiment the record carrier 508 is an optical information carrier. The write means 506 now include an optical write head 510 for writing the information in a track on the record carrier 508.

Figure 5:
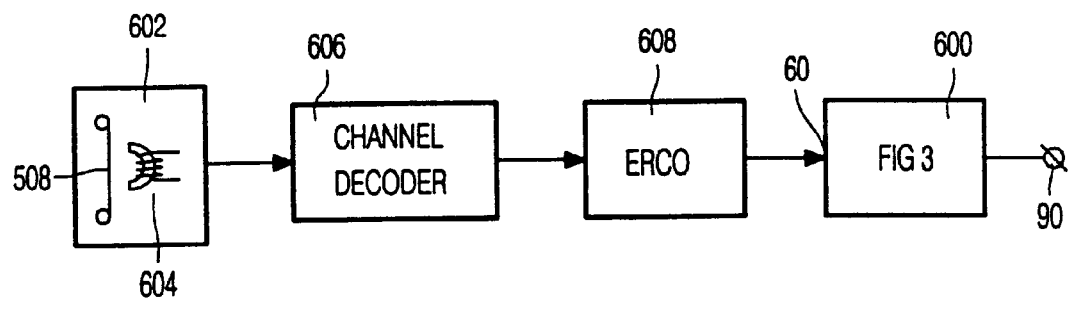
FIG. 5 shows a block diagram of a receiving device in the form of a reproducing apparatus.

FIG. 5 shows a receiving device in the form of an apparatus for reproducing the digital information signal from the record carrier. The circuit block 600 in FIG. 5 replaces the block diagram of FIG. 3. The input 60 of the circuit block 600 is identical to the input 60 of the demultiplexing unit 62 in FIG. 3 and the output terminal 90 in FIG. 5 is identical to the output terminal 90 of the receiving device in FIG. 3. The reproducing apparatus further includes read means 602, a channel decoder 606 and means 608 for detecting and, if possible, correcting errors in the signal. Channel decoders and error detection/correction means are generally known from the state of the art. The read means are adapted to read the signal recorded on the record carrier 508 and to apply the read signal to a channel decoder 606. The record carrier 508 can be of the magnetic type. In that case the read means 602 include one or more magnetic heads 604 for reading the information from a track on the record carrier 508. In another embodiment the record carrier 508 is an optical information carrier. The read means 602 now include an optical read head 604 for reading the information from a track on the record carrier 508.

An apparatus in accordance with the invention may include both a transmitting device and a receiving device. The combination of the apparatuses shown in FIG. 4 and FIG. 5 yields an apparatus which enables a digital information signal to be stored on the record carrier and to read and reproduce the recorded digital information signal form the record carrier at a later instant. Another possibility is that two apparatuses which both include a transmitting and receiving device communicate with one another via one or more transmission media. The first apparatus transmits a digital information signal to the second apparatus via one or more transmission media by means of its transmitting device. The second apparatus receives this signal by means of the receiving device and reproduces this signal at the output. In a similar manner the second apparatus can transmit a digital information signal to the second apparatus via a second transmission medium. Depending on the physical form of the transmission medium one or more transmission media will be used.

Although the invention has been described for a limited number of embodiments given by way of examples, it will be obvious that the invention is not limited to merely these examples. A person skilled in the art will be able to conceive various modifications within the scope of the invention as defined in the claims.

The invention further resides in any novel characteristic feature or combination of characteristic features.

What is claimed is:

1. A transmitter comprising:

adaptive encoder means for adaptively compressing a digital information signal into an encoded signal and for generating a parameter signal the parameter signal containing parameters indicating the adaptations of the encoder, the adaptations depending on the contents of the digital information signal, the parameters being required to adapt an adaptive decoder for decompressing the adaptively encoded signal;

a first signal combination means for combining the encoded signal and a representation of the parameter signal so as to obtain a transmission signal for transmission via a transmission medium;

prediction filter means for deriving a prediction signal which is an approximation of the parameter signal; and a second signal combination unit for combining the prediction signal and the parameter signal so as to obtain the representation of the parameter signal.

2. The device of claim 1, in which the adaptive encoder means includes an arithmetic encoder.

3. The device of claim 1, in which the adaptive encoder means includes an adaptive prediction filter.

4. The device of claim 1, in which the parameter signal includes coefficients of the adaptive encoder.

5. The device of claim 1 in which the order of a transfer function of the prediction filter is at least two.

6. The device of claim 1, in which the prediction filter has the transfer function $H(z)=2z^{-1}-z^{-2}$.

7. The device of claim 1, further comprising: means for recording the transmission signal on a record carrier.

8. The device of claim 7, further comprising an error-correction encoder.

9. The device of claim 7, further comprising a channel-encoder unit.

10. The device of claim 1, in which the prediction filter has the transfer function $H(z)=3z^{-1}-3z^{-2}+z^{-3}$.

11. The device of claim 1, in which the prediction filter has the transfer function $H(z)=9/8z^{-1}+5/8z^{-2}6/8z^{-3}$.

12. The device of claim 1, in which the prediction filter has the transfer function $H(z)=-z^{-1}$.

13. The device of claim 1, in which:

the adaptive encoder means includes an arithmetic encoder;

the adaptive encoder includes an adaptive prediction filter;

the order of a transfer function of the prediction filter is at least two;

the prediction filter has one or more transfer functions selected from the functions:

$H(z)=2z^{-1}-z^{-2}$;

$H(z)=3z^{-1}3z^{-2}+z^{-3}$;

$H(z)=9/8z^{-1}+5/8z^{-2}-6/8z^{-3}$;

and $H(z)=z^{-1}$;

the parameter signal includes coefficients of the adaptive encoder; and the device further comprises:

means for recording the transmission signal on a record carrier;

an error-correction encoder; and a channel-encoder unit.

14. A receiver comprising:

receiving means for receiving a transmission signal from the transmission medium;

demultiplexing means for deriving an encoded signal and a representation of a parameter signal from the transmission signal;

adaptive decoder means for adaptively expanding the encoded signal into a digital information signal depending on a parameter signal, the parameter signal containing parameters indicating adaptations of the decoder required to decode the encoded signal, the adaptations depending on the contents of the digital information signal;

a signal combination unit for combining the representation of the parameter signal and a prediction signal so as to form the parameter signal; and prediction filter means for deriving the prediction signal which is an approximation of the parameter signal.

15. The device of claim 14, in which the adaptive decoder means includes an adaptive arithmetic decoder.

16. The device of claim 14, in which the adaptive decoder means includes an adaptive prediction filter.

17. The device of claim 14, further comprising means for reproducing a transmission signal recorded on a record carrier.

18. The device of claim 14, further comprising a channel decoder.

19. The device of claim 14, further comprising an error-correction decoder.

20. The device of claim 14, in which the order of a transfer function of the prediction filter is at least two.

21. The device of claim 14, in which the prediction filter has the transfer function $H(z)=2z^{-1}-z^{-2}$.

22. The device of claim 14, in which the prediction filter has the transfer function $H(z)=3z^{-1}-3z^{-2}+z^{-3}$.

23. The device of claim 14, in which:

the adaptive decoder means includes an adaptive arithmetic encode;

the adaptive decoder means includes an adaptive prediction filter;

the order of a transfer function of the prediction filter is at least two;

the prediction filter has one or more transfer functions selected from the functions:

$H(z)=2z^{-1}-z^{-2}$;

$H(z)=3z^{-1}3z^{-2}+z^{-3}$;

$H(z)=9/8z^{-1}+5/8z^{-2}-6/8z^{-3}$;

and $H(z)=z^{-1}$;

the parameter signal includes coefficients of the adaptive decoder; and the device further comprises:

means for reproducing the transmission signal from a record carrier;

an error-correction decoder; and a channel-decoder unit.

24. The device of claim 14, in which the prediction filter has the transfer function $H(z)=9/8z^{-1}+5/8z^{-2}6/8z^{-3}$.

25. The device of claim 14, in which the prediction filter has the transfer function $H(z)=-z^{-1}$.

26. A method of transmitting a signal comprising the steps of:

receiving a digital information signal;

adaptively compressing the digital information signal into an encoded signal;

generating a parameter signal, the parameter signal containing parameters indicating the adaptations of the adaptive compressing, the adaptations depending on the contents of the digital information signal, the parameters being required for adaptively decompressing the encoded signal;

combining the encoded signal and a representation of the parameter signal into a transmission signal;

predictive filtering for deriving a prediction signal which is an approximation to the parameter signal;

combining the prediction signal and the parameter signal so as to obtain the representation of the parameter signal; and transmitting the transmission signal via a transmission medium.

27. The method of claim 26, in which the transmission step includes storing the transmission signal on a record carrier.

28. A record carrier produced by the method of claim 26.

29. The record carrier of claim 28 in which the record carrier includes an optical or magnetic recording medium.

30. A transceiver comprising:

adaptive encoder means for adaptively compressing a digital information signal into an encoded signal and for generating a parameter signal the parameter signal containing parameters indicating the adaptations of the encoder, the adaptations depending on the contents of the digital information signal, the parameters being required to adapt an adaptive decoder for decompressing the adaptively encoded signal;

a first signal combination unit for combining the encoded signal and a representation of the parameter signal so as to obtain a transmission signal for transmission via a transmission medium;

first prediction filter means for deriving a prediction signal which is an approximation of the parameter signal;

a second signal combination unit for combining the prediction signal and the parameter signal to obtain the representation of the parameter signal;

receiving means for receiving a transmission signal from the transmission medium;

demultiplexing means for deriving an encoded signal and a representation of a parameter signal from the transmission signal;

adaptive decoder means for adaptively expanding the encoded signal into a digital information signal depending on the parameter signal;

a third signal combination unit for combining the representation of the parameter signal and a prediction signal so as to form the parameter signal; and second prediction filter means for deriving the prediction signal which is an approximation to the parameter signal.

* * * * *